(12) United States Patent
Moore

(10) Patent No.: US 10,613,442 B2
(45) Date of Patent: Apr. 7, 2020

(54) COMPOSITIONS AND METHODS THAT PROMOTE CHARGE COMPLEXING COPPER PROTECTION DURING LOW PKA DRIVEN POLYMER STRIPPING

(71) Applicant: AZ ELECTRONIC MATERIALS (LUXEMBOURG) S.À R.L., Luxembourg (LU)

(72) Inventor: John Cleaon Moore, Camarillo, CA (US)

(73) Assignee: Merck Patent GmbH, Darmstadt (DE)

( * ) Notice: Subject to any disclaimer, the term of this patent is extended or adjusted under 35 U.S.C. 154(b) by 261 days.

(21) Appl. No.: 15/554,578

(22) PCT Filed: Mar. 11, 2016

(86) PCT No.: PCT/EP2016/055252
§ 371 (c)(1),
(2) Date: Aug. 30, 2017

(87) PCT Pub. No.: WO2016/142507
PCT Pub. Date: Sep. 15, 2016

(65) Prior Publication Data
US 2018/0074408 A1    Mar. 15, 2018

Related U.S. Application Data

(60) Provisional application No. 62/132,469, filed on Mar. 12, 2015.

(51) Int. Cl.
| | |
|---|---|
| *C11D 7/50* | (2006.01) |
| *G03F 7/42* | (2006.01) |
| *C09D 5/20* | (2006.01) |
| *C11D 3/20* | (2006.01) |
| *C11D 3/43* | (2006.01) |
| *C11D 11/00* | (2006.01) |
| *C23G 1/06* | (2006.01) |
| *C23G 1/10* | (2006.01) |
| *C23G 5/032* | (2006.01) |

(52) U.S. Cl.
CPC .............. *G03F 7/426* (2013.01); *C09D 5/20* (2013.01); *C11D 3/2075* (2013.01); *C11D 3/43* (2013.01); *C11D 11/0047* (2013.01); *C23G 1/06* (2013.01); *C23G 1/103* (2013.01); *C23G 5/032* (2013.01)

(58) Field of Classification Search
CPC .................................................. C11D 11/0047
See application file for complete search history.

(56) References Cited

U.S. PATENT DOCUMENTS

| | | | |
|---|---|---|---|
| 6,231,677 B1 * | 5/2001 | Ishikawa | G03F 7/42 134/3 |
| 6,551,973 B1 | 4/2003 | Moore et al. | |
| 2011/0253171 A1 * | 10/2011 | Moore | G03F 7/422 134/6 |
| 2012/0108486 A1 * | 5/2012 | Quillen | C11D 7/34 510/176 |
| 2014/0076356 A1 * | 3/2014 | Daviot | G03F 7/422 134/3 |

FOREIGN PATENT DOCUMENTS

| | | |
|---|---|---|
| EP | 093934 A1 | 9/1999 |
| GB | 2021285 A1 | 10/2011 |
| WO | 2012168485 A1 | 12/2012 |

OTHER PUBLICATIONS

International Search Report, PCT/EP2016/055252, dated Jun. 2, 2016, corresponds to U.S. Appl. No. 15/554,578, national phase entry filed on Aug. 30, 2017.

* cited by examiner

*Primary Examiner* — Gregory E Webb
(74) *Attorney, Agent, or Firm* — Francis M. Houlihan

(57) ABSTRACT

The present invention is a charge complexing chemical composition that protects metal during polymer removal. The polymer coatings include crosslinked systems by chemical-amplification and photoacid generated (PAG) means as in epoxies. The system includes a solvent, a charge complexing additive, and an acid that creates a protective complex for sensitive metals during the dissolving and rinsing practice needed for processing microelectronic parts. The composition can be utilized with a method for removing partial and fully cured crosslinked coatings that originate from chemical amplification or PAG-epoxy photoimageable coatings.

16 Claims, No Drawings

COMPOSITIONS AND METHODS THAT PROMOTE CHARGE COMPLEXING COPPER PROTECTION DURING LOW PKA DRIVEN POLYMER STRIPPING

This application is a United States National Stage Patent Application under 35 U.S.C. § 371 of International Patent Application No. PCT/EP2016/055252, filed Mar. 11, 2016, which claims priority to U.S. Provisional Patent Application No. 62/132,469, filed Mar. 12, 2015, the contents of each of which are being hereby incorporated herein by reference.

BACKGROUND OF THE INVENTION

This invention relates to a chemical stripper composition that protects copper metal during the removal of cross-linked polymer coatings using conditions of acidic conditions (low pKa). Materials removed in low pKa conditions include negative-tone chemically amplified (e.g. epoxy) and acid-catalyzed photoimageable coatings. Many commercialized strippers for microelectronic coatings do not perform sufficiently to meet minimum manufacturing requirements. The invention provides a commercial framework to create removal products for cross-linked systems that respond in acidic media without the harmful etching and damaging effects commonly observed on devices that contain copper.

For various processed conditions up to and including hard-baking or otherwise referred to as full-cure, the composition will remove and dissolve chemically-amplified reacted compounds within minutes without damaging effects to sensitive metals such as copper, using conventional immersion conditions at elevated temperatures. Such full-cure coatings are found to be resistant to conventional organic strippers that commonly comprise alkaline ingredients as exemplified in U.S. Pat. No. 6,551,973 (2003), Moore et al. Using these conventional strippers, no dissolution occurs. Instead, these conventional alkaline strippers are observed to remove the coating by mechanisms of lifting or breaking-up into pieces. This lift-off mechanism generates incomplete removal from complex three dimensional topographies as commonly seen in microelectromechanical systems (MEMS) devices. Un-dissolved material will produce particles that are circulated throughout the bath, causing re-deposition of the un-dissolved pieces onto other areas of the device. Such contamination that occurs onto these tiny computer controlled gears, sensors, springs, pumps, and related micro or nano-scale fixtures results in contamination and device failure. It is an object of this invention to achieve full-dissolving of the unwanted polymer material during the given stripping and removal period.

Full dissolution offers the advantage of efficient rinsing and filtration of the recycled composition. The composition has been found to be especially useful in the manufacture of semiconductor wafers, MEMS devices, and displays. During the manufacture of these microcircuits or micro-devices, various inorganic substrates such as single and polycrystalline silicon, hybrid semiconductors such as gallium arsenide, and metals, are coated with an organic coating ("photoresist", or resist) which forms a resistant framework of permanent or temporary design and exhibits a pattern after undergoing a photolithographic process. The resist may be utilized to insulate conductors or protect selected areas of the substrate surface, such as silicon, silicon dioxide, or aluminum, from the action of chemicals in both wet (chemical) and dry (plasma) forms. In the case of the material being utilized as a photoresist, exposed areas of the substrate may carry out a desired etch (removal) or deposition (addition) process. Following completion of this operation and after subsequent rinsing or conditioning, it is necessary that the resist and any application post-etch residue be removed to permit essential finishing operations. Upon removal of the resist, specific micro-etched or deposited patterns are left behind. The masking and patterning processes are repeated several times to produce layered arrangements that comprise the art of the final device. Each step requires complete resist stripping and dissolving, to ensure that the final form device is produced at relatively high yields and performs satisfactorily. In US Application No. 2014/0076356 (2012), Dariot et. al describe compositions that use ether solvents with acidic additives to remove certain cross-linked polymer systems. Additionally, in the abandoned application as US No. 2011/0253171A1 (2011), Moore describes stripping chemistries that also acidic additives effect the removal of epoxy-based photoimageable coatings. Neither of these applications teach about chemistries that sufficiently protect copper surfaces to the extent necessary for microelectronic production. More specifically, this application from Dariot et. al is incomplete and not sufficient to ensure metal safety. Namely, there is one example citing a formula that contains oxalic acid, a compound known to produce undesirable residue. Oxalic acid is a common industrial carboxylic acid used for cleaning and complexing oxides of iron and other metals, however, it has strong precipitating effects with due to the copper-oxalate solubility product (Ksp) of $10\textasciicircum e-22$. Residue from this complex, while it may be acceptable for qualitative analysis in grade school, is difficult at best for scaling to a manufacturing process. Additionally, the application by Moore et. al describes the use of inhibitors benzotriazole (BTA) and tolytriazole (TTA), however, these are known to not perform in acidic media. While both of these applications teach removal and stripping practices in acidic media (low pKa), their suggestions for metal protection are insufficient for use in manufacturing practices. It is a further object of this invention to provide stripping and removal practices that can protect complex copper substrates.

It is an object of this invention to provide an improved stripping composition that will remove negative-tone PAG and chemically amplified photoresist that and achieve complete dissolution in minutes. It is also an object of this invention to conduct such photoresist removal from substrates without attack to underlying exposed copper as well as other metals. It is a further object to conduct this photoresist removal and metal protection by utilizing a safe and non-regulated chemistry that does not produce harm to workers or to the environment. These objects and others shall be conducted upon complex inorganic substrates used in the manufacturing of micro-devices such as semiconductors, MEMS, and displays.

SUMMARY OF THE INVENTION

An embodiment of the present invention describes compositions that contain chemistries that exhibit charge resonance in their molecular expression. The properties of charge resonance distribute molecular electronegativity in a manner that maximizes favorable interaction to metal ions. In the condition where chemical dissolving and removal of negative-tone chemically-amplified photoimageable coatings and those with PAG facilitated crosslinkers, the choice of charge transfer resonance of such chemistries is preferred for metal ion protection. Specifically, the charge resonant chemistry of furans are preferred to strip photoresists and related coatings, and more specifically, tetrahydrofurfuryl alcohol (CAS No. 97-99-4) is most preferred. As part of this chemistry, there is also the use of one or more acidic additives exhibiting pKa<3. Inhibitors containing charge resonance character of the enol variety, otherwise described as containing an unsaturated carbon chain adjacent to alcohol functionality. Representative enol inhibitors include fumaric, maleic, and phthalic acid. Inhibitors of the rosin variety and most preferred includes fumarated rosins.

In one embodiment, the solvent is a furan solvent. In one embodiment, the solvent is tetrahydrofurfuryl alcohol (THFA). In one embodiment, the solvent is propylene glycol monomethylether. In one embodiment, the solvent is n-methylpyrollidone (NMP). In one embodiment, the solvent is dimethylsulfoxide (DMSO).

In one embodiment, the solvent is present at concentrations of >40% w/w. In one embodiment, the solvent is present at concentrations of 60-80% w/w. In one embodiment, the solvent is present at concentrations of 85-95% w/w.

In one embodiment, the organic acid is a substituted or unsubstituted sulfonic acid. In one embodiment, the organic acid is an alkylsulfonic acid. In one embodiment, the organic acid is a methanesulfonic acid. In one embodiment, the organic acid is an ethanesulfonic acid. In one embodiment, the organic acid is a propanesulfonic acid. In one embodiment, the organic acid is a butanesulfonic acid. In one embodiment, the organic acid is an arylsulfonic acid. In one embodiment, the arylsulfonic acid is a toluenesulfonic acid. In one embodiment, the sulfonic acid is para-toluenesulfonic acid. In one embodiment, the organic acid is a substituted or unsubstituted alkylarylsulfonic acid. In one embodiment, the alkylarylsulfonic acid is dodecylbenzenesulfonic acid. In one embodiment, the organic acid is a maleic acid. In one embodiment, the organic acid is an oxalic acid. In one embodiment, the organic acid is a formic acid.

In one embodiment, the additive is an inhibitor having charge resonance character. In one embodiment, the additive is an enol inhibitor. In one embodiment, the additive is a carboxylic acid inhibitor. In one embodiment, the additive is a dicarboxylic acid inhibitor. In one embodiment, the additive is a fatty-acid like inhibitor. In one embodiment, the additive is an acrylic acid. In one embodiment, the additive is a rosin with TAN≥100. In one embodiment, the additive is a fumeric modified rosin ester. In one embodiment, the additive is a maleic modified rosin ester. In one embodiment, the additive is a modified ester of tall oil rosin. In one embodiment, the additive is a dimerized gum rosin. In one embodiment, the additive is a dodecanedioic acid.

In one embodiment, the additive has pKa≤6. In one embodiment, the additive has pKa between about 4 to about 6.

In one embodiment, the additive is present at concentrations of 0.1-15% w/w. In one embodiment, the additive is present at concentrations of 1-10% w/w. In one embodiment, the additive is present at concentrations of 3-7% w/w.

One embodiment of the present invention provides a method that aids in semiconductor manufacturing by removing negative-tone chemically-amplified photoimageable coatings with PAG crosslinking utilizing immersion and spray process at elevated temperature that dissolve such coatings and have improved performance over conventional strippers.

The invention operates without the introduction of toxic substances, performs at moderate temperatures, and is deemed safe to soft metals, specifically, to copper. The utility of the system is particularly advantageous in fabricating lines where rapid processing at low temperatures and using a simple rinse is effective for producing clean substrates.

DETAILED DESCRIPTION OF THE INVENTION

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention. However, the order of the description should not be construed as to imply that these operations are necessarily order dependent. In particular, these operations need not be performed in the order of presentation.

The phrase in one embodiment is utilized repeatedly. The phrase generally does not refer to the same embodiment, however, it may. The terms comprising, having and including are synonymous, unless the context dictates otherwise.

While the use of negative-tone PAG initiated and chemically-amplified photoimageable coatings utilized in microdevice fabrication, the removal of such coatings and residues thereof must also occur to complete the device. These practices exist on wafers during back-end wafer-level packaging in a wafer bumping process. The composition and methods of this invention are particularly suitable for the removal of negative-tone PAG and chemically-amplified photoimageable coatings identified as hard-to-remove, or in the case of a full-cure condition, resistant to conventional cleaners. The terms stripping, removing, and cleaning are utilized interchangeably and the terms stripper, remover, and cleaning composition are also utilized interchangeably. The indefinite articles "a" and "an" are intended to include both the singular and the plural noun forms. All composition ranges are inclusive and combinable in any order except where it is clear that such numerical ranges are constrained to add up to 100%. The term "wt %" means weight percent based on the total weight of the stripping composition, unless otherwise indicated.

The composition and method are particularly adapted for removing such coatings from substrates such as wafers or flat panel displays, which may include various layers and structures such as metal, semiconductor and associated organic materials. Typical substrate materials include semiconductor materials such as silicon, gallium arsenide and indium phosphide and sapphire, as well as glass and ceramic and other suitable semiconductor materials.

The composition and method quickly and effectively dissolve and remove negative-tone PAG and chemically-amplified photoimageable coatings from inorganic substrates, from metallic, non-metallic and metalized non-metallic substrates. The composition includes an acidic ingredient, which hydrolyzes cross-linked polymeric substances and releases their monomeric forms to a bulk solvent, which then is rinsed from the substrate. The dissolving and removing cross-linked polymers represent a desirable processing condition for fabricating microcircuits in electronic manufacturing. Although the organic substances to be removed may be cured to a hard and chemically resistant framework when exposed to the customer's process, the composition and method are found to maintain relatively acceptable performance.

The method for stripping an organic substance from an inorganic substrate brings the composition into direct contact with the substrate, with or without heat, for a given time sufficient to dissolve the epoxy-based coating and remove the resulting species by rinsing with water.

When negative-tone PAG and chemically-amplified photoimageable coatings must be dissolved and removed, the composition is brought into direct contact with the substrate containing the coating to be removed. This process condition occurs in immersion, spray, or systems that offer a combination of tasks. After a predetermined time of exposure, the substrates are removed from a bath or chamber and are rinsed with water and dried. Conditions of the exposure may be at a variety of heating conditions in the approximate range of a room temperature of 20° C. to 100° C. Typical performance in using the composition provides complete dissolution within 5-20 minutes at temperatures between 60-80° C., depending upon the post baking process. These results are in stark contrast with conventional composition strippers, which do not dissolve the negative-tone PAG and chemically-amplified photoimageable coatings even when removal is conducted at relatively high temperatures (i.e. at approximately 100° C.) for more than 2 hours.

The composition includes a solvent system based upon the use of furans, and more specifically, tetrahydrofurfuryl alcohol (THFA, CAS No. 97-99-4). THFA is a safe solvent, non-regulated by the US Department of Transportation (DOT), and is commercially available worldwide. THFA expresses a dielectric constant of 13.6 and a dipole moment of 2.1 (>2), as identified in the *CRC Press Handbook of Chemistry and Physics*. THFA comprises approximately 60 weight percent to approximately 99 weight percent, depending upon the pKa of the additive inhibitor. Where the pKa of the inhibitor is between 2-3, the typical amount of THFA being approximately 60 weight percent to approximately 90 weight percent. When the pKa<2 of the additive inhibitor, the frequent typical amount of THFA is approximately 80 weight percent to approximately 99 weight percent.

The composition includes a carboxylic acid inhibitor, and preferably of the di-carboxylic acid variety, expressing a pKa≤6. Such inhibitors include carboxylic acids, poly carboxylic acids, fatty acids, rosins, and combinations thereof. Examples include acids as formic, acetic, oxalic, malic, maleic, propionic, butyric, and higher carbon chain versions. Halogenated carboxylic acids include trichloroacetic, trifluoroacetic, dichloroacetic, bromoacetic, fluoroacetic, chloroacetic, iodoacetic, and nitroacetic. The versions of these acetic conjugates also apply to higher molecular weights. Rosin and acrylic acids that express a pKa value between 4-6 are included as candidate inhibitors for the invention. Candidate low pKa acidic inhibitors include acrylic, methacrylic, crotonic, alpha and beta unsaturated polycarboxylic as fumaric, citraconic, mesaconic, aconitic, itaconic and maleic anhydride versions of these. Additional versions of the rosins include those with acid numbers expressed as total acid number (TAN) at and above 100 which are synthetic or natural, hydrated or fumarated forms, including rosin esters, tall oil resins, terpene based resins and resin modified acid phenol resins. The amount of the low pKa inhibitor used in the system is between one to forty percent (1-40%), specifically five to twenty-five percent (5-25%) for carboxylic acids types, and more specifically two to ten percent (2-10%) for rosin and fatty-acid like inhibitors.

Another embodiment of the invention includes the use of surfactants, preferably of the anionic type, and more preferably of the anionic p-toluenesulfonate (PTS) or dodecylbenzenesulfonate (DBS) variety, including DBS in linear or branched molecular forms. Most preferably is the chemical form of a low pKa version of PTS or DBS whereby they exhibit varying pKa values depending upon amine addition towards neutralization. Common amine reacted PTS and DBS pKa values vary from <2 to >7. Preferred PTS and DBS pKa values are <2.

The composition functions by maintaining a solvency environment when utilized on negative-tone PAG and chemically-amplified photoimageable coatings. During stripping, the solvent provides a dissolution environment for resist removal while the low pKa inhibitor additive protects metallic species present in the substrate micro-device architecture. Normal rinsing is conducted with ispropanol (IPA) and deionized water (DIW). In the optional condition that a low pKa anionic surfactant is used, excellent rinsing with DIW is recognized.

While photoresists comprise both positive and negative tone, this invention focuses on the negative variety, and more specifically, the negative-tone systems that are cured by acid catalysis or chemical amplification. Negative-tone polymer coatings that undergo crosslinking by photoacid generators (PAGs) react upon exposure to acidic ingredients and become insoluble, allowing their unexposed portions to be dissolved and developed. This produces patterns or masks that are observed as negative images of the radiation exposed design. Negative-tone materials are cross-linked and have a reputation of being more difficult to remove as compared to thermoplastic (non-crosslinked) polymers. Several cross-linkable systems exist in the market utilized as photoresists and dielectrics. These include polyimide (PI), bis-benzocyclobutene (BCB), cyclized isoprene, photopolymeric (e.g. acrylic), epoxy, and mixtures thereof. In some cases, these crosslinkable systems are blended with conventional polymers used in positive-tone systems as polyhydroxystyrene or novolak resins.

Many PAG systems utilize epoxy-based resins. Epoxies are preferred over other conventional materials due to their rapid processing conditions, rigid character, high resolution, low permeability, and robust chemical resistance. The epoxy-based polymer is three dimensional, a product of cationic photo-initiated ring opening of the epoxy, followed by condensation polymerization, making it a good candidate for between-chain crosslinking. The result is a rigid polymer network utilized as a permanent insulator or as a temporary resist.

Most PAG systems include onium salts, for example, their complexes of strong acids such as fluorinated borates, antimonates, sulfonates, and triflate. Iodonium compounds of similar acidic varieties also exist in such resists and photoimageable compounds. Common varieties of PAG negative-tone coatings include epoxy-based curing systems. Following coating, and ultraviolet (UV) light exposure, this is followed by a post-exposure bake stage that is typically a thermal heating up to approximately 100° C. The combination of these steps facilitates the photochemical reaction and subsequent polymerization to achieve a partial-cure state. A full-cure state is achieved when a hard-bake step that is typically heating above 100° C., and may extend as high as 150° C., to ensure complete cross-linking. At a partial-cure condition, the coating system is less soluble than the unexposed material. The unexposed material is dissolved and rinsed away (developed) from the exposed material, leaving behind a negative image as compared to the pattern in which light has traveled.

When viewing the remaining pattern under a high resolution microscope (i.e. scanning electron microscopy or SEM), the resultant sidewall of the resist is commonly not vertical (i.e.) 90° from top to bottom. In fact, the pattern wall has a negative slope (i.e. less than 90°), as measured from the bottom plane of the developed area. This sloped condition results when a reduced efficiency of the photochemical reaction or crosslinking as light proceeds downward through the epoxy-network, causing less of the polymer to be imaged and cured. At the pattern edge, the polymer near the top surface may be fully exposed, yet a reduced exposure occurs to the material near the bottom. As a result, a greater cross-sectional area of the material at the top of the profile is cured and has a reduced solubility, whereas less curing occurs near the bottom. During the development process, a greater cross-sectional amount of material near the bottom is soluble and therefore, becomes developed and removed. The resulting pattern is viewed to be relatively larger at the top than at the bottom, giving the effect of a negative slope.

This negative slope is useful when the epoxy-based system is utilized as a mask for depositing thick metal lines in a process commonly referred to as deposition and lift-off. Following the patterning process, metal is coated onto the pattern either by plasma deposition or wet chemical plating. After deposition, the mask is stripped from the surface bringing the unwanted metal that was originally deposited directly onto the pattern. This occurs by a solvent stripping process whereby solvent molecules penetrate the cured polymer mask from the side at the negative slope profile. As the solvent penetrates, the mask begins to swell and dissolve, causing the unwanted metal to lift-off. Once the metal and mask enters the bulk chemical, it can then be filtered and reutilized or recycled. After the mask is stripped and metal is lifted off and rinsed away, the metal lines that were originally deposited within the mask pattern are left behind.

Reliability issues may arise in a lift-off process or for any stripping process, due to the variability in exposure conditions. If this variability is due to factors that affect the curing process, it will result in a change of the chemical make-up of the resist. The factors that control a curing process include light, temperature and oxygen. For purposes of this description, the focus will be limited to temperature, one of the most common variables in a manufacturing process. Temperature changes may be due to variability in substrate conductivity or thermostat controls when using a hotplate or an oven. An organic material exposed to different temperatures may exhibit varying densities in its bulk form and show changes in surface composition. This is observed in oven-cured polymers where a material coating is heated by convection.

It is generally observed that polymers exposed to convection heat will cure to a higher extent due to the formation of a surface skin. The surface skin results from direct contact with heat in the environment (i.e. convection heat), causing accelerated curing to form a higher bulk density polymer at the surface (i.e. skin). The polymer skin commonly solvates much slower than a material that is cured internally or at lower temperatures. Accordingly, temperature variation is a common process variable, which may produce coatings, which exhibit a range of solubility characteristics. A composition that is designed to solvate polymers exposed to temperature extremes therefore will be robust for general cleaning processes.

As it is common to perform resist stripping between processing steps in the manufacture of a device, such stripping must be conducted in a manner that is timely, is safe for workers, and does not produce a burden in the handling characteristics of the fabrication plant. When stripping negative-tone resists, these systems are commonly more thick than their positive counterparts, are more densely cross-linked, and require more aggressive chemicals to effect removal. To meet these needs, higher temperatures and longer times in removal is commonly practiced. These conditions promote more acute worker safety concerns and result in chemical attack of the device metallic architecture producing etched, pitted, or otherwise corroded surfaces. In some conditions, conventional strippers do not dissolve the resist, while instead it is lifted and broken-up into pieces that can redeposit as contamination over many surfaces, resulting in low yields or otherwise completely scrapping the product.

When utilized in combination with metals at given processing times, the composition is found to be safe with relatively soft metals, such as aluminum and copper. The composition is non-toxic, easily rinsed with water, and when deemed spent, it may be disposed directly to a common organic waste stream collection system that is typical in most electronic fabrication plants.

EXAMPLES

The compositions of the invention and the method of making of the examples are described. It is understood, however, that the invention is not meant to be limited to the details described therein. In the examples, the percentages provided are percent (%) by weight unless otherwise stated.

The invention is further illustrated, without limitation, by the following examples. The measurement of performance and selectivity of the invention is conducted using practices readily accepted by the industry. In such cases, measurement is made by optical microscope, etch rate determinations by high sensitivity gravimetric tests on metallic substrates, and where necessary, more detailed studies by using scanning electron microscopy (SEM).

In the following examples, silicon wafers are used as the inorganic substrate upon which the organic substance (photoimageable coating, etc.) is applied and cured. This material forms the basis for the survey, which the invention is demonstrated.

The chemically amplified photoimageable coating used for demonstration is of the variety AZ-15nXT, manufactured by AZ Electronic Materials (AZEM), located in Branchburg N.J. (USA, www.azem.com). As of the date of this filing, AZEM became a subsidiary of Emanuel Merck Darmstadt (EMD), part of the global business Merck KGaA Darmstadt Germany (www.emdgroup.com).

The AZ-15nXT coating has various available viscosities (e.g. 115 cps, 450 cps) that dictate thickness using spin-coating practices. For the variety 450 cps, 10-15 um coating thickness is achieved by common rpm values of 1000-1500. The coating is applied in a spin-coating manner utilizing a Brewer Science, Inc. CB-100 coater and following standard protocol for applying the liquid form of the polymer material (organic substance) to the said inorganic substrate. Once the material is coated, it is sent to a soft bake step on a hot plate at a defined temperature and time period. The material is exposed to ultraviolet light (UV) of a broad-band type emitting at 365 nm and of a high exposure dose of 0.12 W/cm2-sec, 60 sec. To elicit the chemical amplified reaction, the exposed coating is then post exposure-baked (PEB)

at 120° C. for 60 seconds. The crosslinking resist layer is hard-baked to 110° C., and in extreme cases to 150° C., utilizing a hot plate for a time of 5 min.

Negative-tone epoxy-based coatings utilized in this characterization are based upon those utilized from Rohm and Haas Electronic Materials (RHEM), now owned by DOW Chemical based upon the acquisition in 2009. The epoxy-based coatings are photoimageable and are under the trade name Intervia™ as a dielectric coating for semiconductor packaging applications. The epoxy-based coating utilized is the Intervia™ 8023-series. Typical processing conditions includes application by a spin-coating process in the range of approximately 100-1500 rpm, soft bake at approximately 140° C., exposing the epoxy to UV light in the range of approximately 350-450 nm, post-exposure baking at approximately 100° C. (PEB), and a final cure at approximately 200° C. All baking steps are performed by a hot plate. As epoxy coatings are intended to be permanent, the removal of this material is difficult. Unlike a photoresist, the removal of this epoxy dielectric is not common to the process. Where removal is necessary, that practice is considered to be "re-work", whereby the permanent system is removed prior to a final state. Once an epoxy system is classed as final cure, it is considered difficult or impossible to remove. For purposes of this invention, the epoxy cured Intervia™ 8023-series coated wafers are taken only at the PEB step (i.e. 100° C.).

Solvents, additives, surfactants and other chemicals and materials are acquired from Sigma-Aldrich distribution company (www.sigmaaldrich.com). Materials not acquired by this company are otherwise identified. Strippers classified as conventional are based upon alkaline additives mixed with common aprotic solvents. These include the following:

Conventional strippers A & B: represented as AZ-based strippers, tetramethylammonium hydroxide (TMAH, CAS 75-59-2) prepared anhydrous in propylene glycol (PG, CAS 57-55-6) as 6% TMAH in PG and mixed with n-methylpyrollidone (NMP, CAS 872-50-4) at concentrations of 1:1 and 1:3 (TMAH/PG:NMP) and labeled as AZ 300T and 400T, respectively. The AZ 300T and 400T are measured for activity as normality and determined to be ~0.37N and 0.175N, respectively.

Conventional stripper C: represented as GenSolve 470/475, this product is prepared similarly as described for the other similar strippers, however, benzyltrimethylammonium hydroxide (BTMAH, CAS 100-85-6) is used in ethylene glycol (EG, CAS 107-21-1) at a stock concentration of 40% (w/w) and mixed with NMP at a ratio of 1:4 (BTMAH/EG:NMP) and tested for activity as ~0.48N.

For process demonstration and testing, remanufactured silicon substrates are used at diameters of 100-200 mm (4-8") of known crystal orientation and thickness (1-0-0, ~525 µm; Wollemi Technical, Inc. Taiwan, www.wollemi.com.tw). Silicon 200 mm (8") wafers with copper sputter coating are used for metal protection testing using 15,000 Å (angstroms) Cu on 250 Å (angstroms) Ta (Addison Engineering, www.addisonengineering.com).

Example #1

The following example demonstrates the resist removal dynamics, indicating that stripping on simple smooth substrates occurs by lift-off, however full dissolution is driven by the presence of acid in the cleaner.

Coated silicon wafers with AZ 15nXT (450 cps) PR are prepared on 150 mm (6") Si wafers as previously described using a 150° C. post exposure hard bake. Stripping tests are performed at 70-80° C. and are allowed to work in contact with the PR for up to 2 hr (120 min) with regular inspection to confirm lift-off, dissolution, or other similar practice. The results are listed in Table 1.

TABLE 1

AZ 15nXT PR removal in cleaner solvents at 70-80° C. (NC = no change in 2 hrs).

| # | Chemistry | Additive | Solution Acidity | Lift-Off (min) | Dissolve (min) |
|---|---|---|---|---|---|
| 1 | Propylene glycol monomethylether (CAS 107-98-2) | none | neutral | <10 | NC |
| 2 | NMP | none | neutral | <10 | NC |
| 3 | Dimethylsulfoxide (DMSO, CAS 67-68-5) | none | neutral | <10 | NC |
| 4 | Tetrahydrofurfuryl alcohol (THFA, CAS 97-99-4) | none | neutral | <10 | NC |
| 5 | Conventional stripper A (AZ 300T)* | N/A | alkali | <10 | NC |
| 6 | Conventional stripper B (AZ 400T)* | N/A | alkali | <10 | NC |
| 7 | Conventional stripper C (GenSolve 475)* | N/A | alkali | <10 | NC |
| 8 | Propylene glycol monomethylether (CAS 107-98-2) | Methane sulfonic acid (MSA, CAS 75-75-2), 5% w/w | acid | <10 | <20 |
| 9 | NMP | MSA 5% w/w | acid | <10 | <20 |
| 10 | Dimethylsulfoxide (DMSO, CAS 67-68-5) | MSA 5% w/w | acid | <10 | <20 |
| 11 | Tetrahydrofurfuryl alcohol (THFA, CAS 97-99-4) | MSA 5% w/w | acid | <10 | <20 |

*Conventional stripper A: tetramethylammonium hydroxide (TMAH, CAS 75-59-2) prepared anhydrous as 6% (w/w) in propylene glycol (PG, CAS 57-55-6) TMAH in PG and mixed with n-methylpyrollidone (NMP, CAS 872-50-4) at a concentration of 1:1 (TMAH/PG:NMP), tested for activity as ~0.37N;
*Conventional stripper B: tetramethylammonium hydroxide (TMAH, CAS 75-59-2) prepared anhydrous 6% (w/w) in propylene glycol (PG, CAS 57-55-6) and mixed with n-methylpyrollidone (NMP, CAS 872-50-4) at a concentration of 1:3 (TMAH/PG:NMP), tested for activity as ~0.175N;
*Conventional stripper C: benzyltrimethylammonium hydroxide (BTMAH, CAS 100-85-6) prepared anhydrous at 40% (w/w) in ethylene glycol (EG, CAS 107-21-1) and mixed with NMP at a ratio of 1:4 (BTMAH/EG:NMP) and tested for activity as ~0.48N.

Example #2

The following example demonstrates the removal dynamics on a PAG cured epoxy system, indicating that stripping on simple smooth substrates occurs by full dissolution based upon the presence of acid in the cleaner.

Coated silicon wafers with DOW Intervia™ 8023-series dielectric are prepared on 150 mm (6") Si wafers as previously described using a 100° C. PEB. Stripping tests are performed at 70-80° C. and are allowed to work in contact with the dielectric for up to 2 hr (120 min) with regular inspection to confirm removal. The results are listed in Table 2.

TABLE 2

DOW Intervia™ 8023-series in cleaner solvents at 70-80° C. (NC = no change in 2 hrs).

| # | Chemistry | Additive | Solution Acidity | Dissolve time (min) |
|---|---|---|---|---|
| 1 | Propylene glycol monomethylether (CAS 107-98-2) | none | neutral | NC |
| 2 | NMP | none | neutral | NC |
| 3 | Dimethylsulfoxide (DMSO, CAS 67-68-5) | none | neutral | NC |
| 4 | Tetrahydrofurfuryl alcohol (THFA, CAS 97-99-4) | none | neutral | NC |
| 5 | Conventional stripper A (AZ 300T)* | N/A | alkali | NC |
| 6 | Conventional stripper B (AZ 400T)* | N/A | alkali | NC |
| 7 | Conventional stripper C (GenSolve 475)* | N/A | alkali | NC |
| 8 | Propylene glycol monomethylether (CAS 107-98-2) | Methane sulfonic acid (MSA, CAS 75-75-2), 5% w/w | acid | <20 |
| 9 | NMP | MSA 5% w/w | acid | <20 |
| 10 | Dimethylsulfoxide (DMSO, CAS 67-68-5) | MSA 5% w/w | acid | <20 |
| 11 | Tetrahydrofurfuryl alcohol (THFA, CAS 97-99-4) | MSA 5% w/w | acid | <20 |

*Conventional stripper A: tetramethylammonium hydroxide (TMAH, CAS 75-59-2) prepared anhydrous as 6% (w/w) in propylene glycol (PG, CAS 57-55-6) TMAH in PG and mixed with n-methylpyrollidone (NMP, CAS 872-50-4) at a concentration of 1:1 (TMAH/PG:NMP), tested for activity as ~0.37N;
*Conventional stripper B: tetramethylammonium hydroxide (TMAH, CAS 75-59-2) prepared anhydrous as 6% (w/w) in propylene glycol (PG, CAS 57-55-6) and mixed with n-methylpyrollidone (NMP, CAS 872-50-4) at a concentration of 1:3 (TMAH/PG:NMP), tested for activity as ~0.175N;
*Conventional stripper C: benzyltrimethylammonium hydroxide (BTMAH, CAS 100-85-6) prepared anhydrous at 40% (w/w) in ethylene glycol (EG, CAS 107-21-1) and mixed with NMP at a ratio of 1:4 (BTMAH/EG:NMP) and tested for activity as ~0.48N.

Example #3

The following example demonstrates the sensitivity of copper in a series of solutions representative of the acidic nature of the cleaner chemistry. Copper coated wafers are used and exposed to the chemistry at 70-80° C. for 15 & 30 min with regular inspection to confirm the condition of the metal. Microscopic inspection for the presence of surface haze as indicative of etching. Surface haze can be identified and confirmed at levels more sensitive than gravimetric analysis (<10 Å/min). The results are listed in Table 3.

TABLE 3

Copper exposed to stripper chemistry at 70-80° C. for 15 & 30 min.

| # | Chemistry | Additive | Solution Acidity | Cu surface 15 min | Cu surface 30 min |
|---|---|---|---|---|---|
| 1 | Conventional stripper A (AZ 300T)* | N/A | alkali | NC | NC |
| 2 | Conventional stripper B (AZ 400T)* | N/A | alkali | NC | NC |
| 3 | Conventional stripper C (GenSolve 475)* | N/A | alkali | NC | NC |
| 4 | Propylene glycol monomethylether (CAS 107-98-2) | Methane sulfonic acid (MSA, CAS 75-75-2), 5% w/w | acid | Removed | NT |
| 5 | NMP | MSA 5% w/w | acid | Haze | Removed |
| 6 | Dimethylsulfoxide (DMSO, CAS 67-68-5) | MSA 5% w/w | acid | Haze | Removed |
| 7 | Tetrahydrofurfuryl alcohol (THFA, CAS 97-99-4) | MSA 5% w/w | acid | NC | Haze |

Inspection results are rated as: NC = no change (good), Haze = etching observed, Removed = serious corrosion.
*Conventional stripper A: tetramethylammonium hydroxide (TMAH, CAS 75-59-2) prepared anhydrous as 6% (w/w) in propylene glycol (PG, CAS 57-55-6) TMAH in PG and mixed with n-methylpyrollidone (NMP, CAS 872-50-4) at a concentration of 1:1 (TMAH/PG:NMP), tested for activity as ~0.37N;
*Conventional stripper B: tetramethylammonium hydroxide (TMAH, CAS 75-59-2) prepared anhydrous as 6% (w/w) in propylene glycol (PG, CAS 57-55-6) and mixed with n-methylpyrollidone (NMP, CAS 872-50-4) at a concentration of 1:3 (TMAH/PG:NMP), tested for activity as ~0.175N;
*Conventional stripper C: benzyltrimethylammonium hydroxide (BTMAH, CAS 100-85-6) prepared anhydrous at 40% (w/w) in ethylene glycol (EG, CAS 107-21-1) and mixed with NMP at a ratio of 1:4 (BTMAH/EG:NMP) and tested for activity as ~0.48N.

Example #4

The following example demonstrates the resist removal dynamics by dissolution in THFA solvent solutions with various acids categorized by pKa. Each solution is prepared with 0.5M of acid mixed into THFA. Due to solubility limits, certain acid solutions exhibit insoluble at room temp. All dissolve at the elevated temperature of 70-80° C.

Coated silicon wafers with AZ 15nXT (450 cps) PR are prepared on 150 mm (6") Si wafers as previously described using a 150° C. post exposure hard bake. Stripping tests are performed at 70-80° C. and are allowed to work in contact with the PR for up to 30 min with regular inspection to confirm dissolution. Results suggest acids with pKa<3 dissolve the AZ 15nXT PR at the identified process. The results are listed in Table 4.

TABLE 4

AZ 15nXT PR removal in THFA solvent with 0.5M acid addition categorized according to pKa. Removal test is conducted at 70-80° C. for a duration of 30 min.

| # | Acid & CAS# | pKa | Dissolve (30 min) |
|---|---|---|---|
| 1 | Caprylic (124-07-2) | 4.89 | No |
| 2 | Acetic (64-19-7) | 4.75 | No |
| 3 | Isophthalic (di-carboxylic, 121-91-5) | 3.46, 4.46 | No |
| 4 | Citric (77-92-9) | 3.13, 4.76, 6.4 | No |
| 5 | Fumaric (di-carboxylic, 110-17-8) | 3.03, 4.44 | No |
| 6 | Maleic (110-16-7) | 1.9 | Yes |
| 7 | Oxalic (di-carboxylic, 144-62-7) | 1.25, 4.14 | Yes |
| 8 | Formic (64-18-6) | <1 | Yes |
| 9 | Methane sulfonic (75-75-2) | <1 | Yes |

Example #5

The following example demonstrates the dynamics of stripper activity over long term stability testing in THFA solvent solutions. The activity of the stripper chemistry is evaluated over time while it is being held at the process temperature of 70-80° C. Solutions are chosen from Example #4 (#6 Maleic acid & two variations of #9 methane sulfonic acid). These chemistries are prepared and filled into vessels that are capped and held in an oven operated at 70-80° C. Samples are collected from the vessels at time=0 (start) and at two further intervals of ~1 day (~24 hrs) and ~1 week (~168 hrs). Testing is conducted by analytical titration for free-acid. Namely, where acidity is preserved and not depleted, that candidate is considered to be more stable. The results are listed in Table 5.

TABLE 5

Activity as molarity is measured at specific intervals, including the calculation of % activity (compared to original value).

| # | Acid & CAS# | Molarity at start (Time = 0) | Molarity ~1 day | Molarity ~7 days |
|---|---|---|---|---|
| 1 | Maleic (110-16-7) | 0.459 (100%) | 0.337 (72%) | 0.217 (46%) |
| 2 | Methane sulfonic (75-75-2) | 0.177 (100%) | 0.170 (99%) | 0.171 (100%) |
| 3 | Methane sulfonic (75-75-2) | 0.357 (100%) | 0.350 (99%) | 0.348 (98%) |

Example #6

As a final proof of performance, the stripper chemistries from the stability tests performed in Example #5 are confirmed for cleaning of the AZ 15nXT (450 cps) PR. Coated silicon wafers with AZ 15nXT (450 cps) PR are prepared on 150 mm (6") Si wafers as previously described using a 150° C. post exposure hard bake. Stripping tests are performed at 70-80° C. and allowed to work in contact with the PR for the same period of time as determined in Example #4. This time is 30 min with regular inspection to confirm lift-off and dissolution. The results are listed in Table 6.

TABLE 6

AZ 15nXT PR removal in solutions from Table 5, conducted at the noted time increments, with cleaning performed at 70-80° C. for a duration of 30 min.

| # | Acid & CAS# | Dissolve in <30 min (Time = 0) | Dissolve in <30 min ~1 day | Dissolve in <30 min ~7 days |
|---|---|---|---|---|
| 1 | Maleic (110-16-7) | Yes | Yes | Yes |
| 2 | Methane sulfonic (75-75-2) | Yes | Yes | Yes |
| 3 | Methane sulfonic (75-75-2) | Yes | Yes | Yes |

Example #7

The following example demonstrates the ability to protect the surface of copper in a series of stripper solutions, which vary by acid type. In an effort to test efficacy of improving the metal appearance, a common inhibitor that is specific for copper, benzotriazole (BTA, CAS #95-14-7), is separately added to each stripper solution and tested for performance. Copper coated wafers are used and exposed to the chemistry at 70-80° C. for shorter times of 10 & 20 min with regular inspection to confirm the condition of the metal surface by visual and microscopic inspection for the presence of surface haze as indicative of etching. Surface haze can be identified and confirmed at levels more sensitive than gravimetric analysis (<10 Å/min). All solutions contain the solvent, Tetrahydrofurfuryl alcohol (THFA, CAS 97-99-4). The results are listed in Table 7.

TABLE 7

Copper exposed to stripper chemistry at 70-80° C. for 10 & 20 min.

| # | Acid in THFA | Cu surface 10 min | Cu surface 20 min |
|---|---|---|---|
| 1 | Methane sulfonic acid (MSA, CAS 75-75-2), 2.5% w/w | Removal | Removal |
| 2 | Methane sulfonic acid (MSA, CAS 75-75-2), 2.5% w/w + BTA 2% w/w | Haze | Haze |
| 3 | Dodecylbenzene sulfonic acid (DDBSA, CAS 68584-22-5), 2.5% w/w | Haze | NC |
| 4 | Dodecylbenzene sulfonic acid (DDBSA, CAS 68584-22-5), 2.5% w/w + BTA 2% w/w | Haze | NC |
| 5 | Oxalic (di-carboxylic, 144-62-7), 2.5% | NC | NC + Residue |
| 6 | Oxalic (di-carboxylic, 144-62-7), 2.5% + BTA 2% w/w | NC | NC + Residue |

Inspection results are rated as: NC = no change (good), Haze = etching observed, Removed = serious corrosion.

Example #8

The following example demonstrates the ability to protect the surface of copper in a series of stripper solutions, which vary by inhibitor addition. Reference to the use of BTA in example #7 is included in these tests for comparison and to evaluate the benefits of metal protection by fatty acid addition. This experiment tests long term ability to protect metal, a period of time of 13 hrs. Copper coated wafers are used and exposed to the chemistry at 70-80° C. for the period of 13 hrs with regular inspection to confirm the condition of the metal surface by visual and microscopic inspection for the presence of surface haze as indicative of etching. Surface haze can be identified and confirmed at levels more sensitive than gravimetric analysis (<10 Å/min). All solutions contain the solvent THFA with the acid DDBSA at elevated concentrations of 20% (~0.5M). The results are listed in Table 8.

TABLE 8

Copper exposed to stripper chemistry at 70-80° C. for 13 hrs.

| # | Fatty Acid Inhibitor | Cu surface 13 hrs |
|---|---|---|
| 1 | Rosin (modified ester of tall oil rosin, Sylvaprint 8190, Arizona Chemical, no CAS# applies) | NC |
| 2 | Rosin (fumaric modified rosin ester, Filtrez 591, Lawter, Inc., no CAS# applies) | NC |
| 3 | Behenic acid (CAS #112-85-6) | Removed |
| 4 | Dodecanedioic acid (CAS #693-23-2) | NC |
|   | Dibasic acid mix (dodecanedioic CAS #693-23-2 30-45% + undecanedioic CAS #1852-04-6 30-45% + sebacic CAS #111-20-6 5-10%, Corfree M1, Invista Corp.) | Removed |
| 5 | Acrylic acid (Joncryl HPD 671, BASF Corp, no CAS# applies) | Haze |
| 6 | Base stripper chemistry (no fatty acid inhibitor) | Removed |
| 7 | Base stripper chemistry (no fatty acid inhibitor) + BTA (#4 from example #7) | Removed |

Inspection results are rated as: NC = no change (good), Haze = etching observed, Removed = serious corrosion.

Example #9

The following example demonstrates the ability to protect the surface of copper in a series of stripper solutions, which vary by inhibitor addition. Reference to the use of rosins as inhibitors in Table 8 (#'s 1&2), they are included in these tests for comparison and to evaluate the benefits of metal protection by charge complexing structures present in fumaric or maleated esters of rosins. This experiment tests ability to protect metal at high temperature (100° C.) for 1 hr. Copper coated wafers are exposed to the chemistry at 100° C. for the period of 1 hr with inspection to confirm the condition of the metal surface by visual and microscopic inspection for the presence of surface haze as indicative of etching. Surface haze can be identified and confirmed at levels more sensitive than gravimetric analysis (<10 Å/min). All solutions contain the solvent THFA with the acid DDBSA at elevated concentrations of 10% (~0.25M). The results are listed in Table 9.

TABLE 9

Copper exposed to stripper chemistry at 100° C. for 1 hr.

| # | Fatty Acid Inhibitor | Cu surface 30 min | Cu surface 60 min |
|---|---|---|---|
| 1 | Rosin (modified ester of tall oil rosin, Sylvaprint 8190, Arizona Chemical, no CAS# applies) | NC | NC |
| 2 | Rosin (fumaric modified rosin ester, Filtrez 531, high MW, Lawter, Inc., no CAS# applies) | NC | NC |
| 3 | Rosin (fumaric modified rosin ester, Filtrez 530, high MW, Lawter, Inc., no CAS# applies) | NC | NC |
| 4 | Rosin (fumaric modified rosin ester, Filtrez 521, low MW, Lawter, Inc., no CAS# applies) | NC | NC |
| 5 | Rosin (fumaric modified rosin ester, Filtrez 591, low MW, Lawter, Inc., no CAS# applies) | NC | NC |
| 6 | Rosin (dimerized gum rosin, Dymerex, Eastman Chemical Company) | NC | Removed |
| 7 | Rosin, (hydrogenated gum rosin, Foral AX-E, Eastman Chemical Company) | Removed | Removed |

Inspection results are rated as: NC = no change (good), Haze = etching observed, Removed = serious corrosion.

Example #10

The following example is a continuation of example #9 and demonstrates the ability to protect the surface of copper in a series of stripper solutions with inhibitor charge complexing protection by fumaric or maleated esters of rosins (Filtrez series, Lawter, Inc.). This experiment tests the ability to protect metal by differing molecular weights of the charge complexing rosin structures. Tests are produced at high temperature (100° C.) for up to 2 hrs. Copper coated wafers are exposed to the chemistry at 100° C. for the period of up to 2 hrs with inspection to confirm the condition of the metal surface by visual and microscopic inspection for the presence of surface haze as indicative of etching. Surface haze can be identified and confirmed at levels more sensitive than gravimetric analysis (<10 Å/min). All solutions contain the solvent THFA with the acid DDBSA at elevated concentrations of 10% (~0.25M). The results are listed in Table 10.

TABLE 10

Copper exposed to stripper chemistry at 100° C. for 1 hr and 2 hrs.

| # | Fatty Acid Inhibitor | Cu surface 1 hr | Cu surface 2 hrs |
|---|---|---|---|
| 1 | Rosin (fumaric modified rosin ester, Filtrez 531, high MW, Lawter, Inc., no CAS# applies) | NC | Haze |
| 2 | Rosin (fumaric modified rosin ester, Filtrez 530, high MW, Lawter, Inc., no CAS# applies) | NC | Haze |
| 3 | Rosin (fumaric modified rosin ester, Filtrez 521, low MW, Lawter, Inc., no CAS# applies) | NC | NC |
| 4 | Rosin (fumaric modified rosin ester, Filtrez 591, low MW, Lawter, Inc., no CAS# applies) | NC | NC |

Inspection results are rated as: NC = no change (good), Haze = etching observed, Removed = serious corrosion.

Although the invention has been described in terms of specific tests and embodiments, it will be apparent that one skilled in the art can substitute other known variants, tests and embodiments without departing from the essence of the invention. Accordingly, the invention is only to be limited by the scope of the appended claims.

While the present invention has been related in terms of the foregoing embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

The invention claimed is:

1. A composition that creates a charge complex with metals as a means of protection during a polymer coating removal process, comprising:
   a solvent;
   an organic acid having a pKa<3; and
   an additive exhibiting charge complexing character,
   wherein said organic acid is one or more substituted or unsubstituted alkylarylsulfonic acids, and
   wherein said additive exhibiting charge complexing character comprises rosin esters.

2. The composition according to claim 1, wherein said solvent is tetrahydrofurfuryl alcohol (THFA).

3. The composition according to claim 2, wherein THFA is present at concentrations of >40% w/w.

4. The composition according to claim 1, wherein the organic acid includes dodecylbenzenesulfonic acid.

5. The composition according to claim 4, wherein the dodecylbenzenesulfonic acid is present at concentrations of 0.25-1 molar.

6. The composition according to claim 1, wherein said additive exhibiting charge complexing character further comprises a dicarboxylic acid.

7. The composition according to claim 6, wherein said dicarboxylic acid is selected from the group consisting of oxalic acid, maleic acid, succinic acid, fumaric acid, phthalic acid, isopthalic acid, and salicylic acid.

8. The composition according to claim 6, wherein the dicarboxylic acid is present at 0.1-15% w/w.

9. The composition according to claim 1, wherein the rosin ester exhibits a total acid number (TAN)≥100.

10. The composition according to claim 1, wherein said additive exhibiting charge complexing character further comprises one or more of fumaric acid, citraconic acid, mesaconic acid, aconitic acid, itaconic acid, maleic acid anhydride, fumarated rosins, maleated rosins, resin modified phenol rosins, tall oil resins, terpene resins, and resin modified acid phenol resins.

11. The composition according to claim 10, wherein said additive exhibiting charge complexing character is a fumaric modified rosin ester.

12. The composition according to claim 11, wherein the fumaric modified rosin ester is present at 0.1-15% w/w.

13. A method for removing polymers which cure by chemically amplified or photoacid generated (PAG) means to produce a coating on a substrate, comprising:
   applying said composition of claim 1 to said coating utilizing a sprayer, an immersion bath or chamber;
   exposing said composition directly on said coating for a predetermined period of time at a predetermined temperature; and
   rinsing and drying said exposed substrate.

14. The method according to claim 13, wherein said period of time is less than 30 minutes.

15. The method according to claim 13, wherein said temperature is 20° C. to 100° C.

16. The method according to claim 13, wherein said coatings are utilized in microelectronics fabrication and semiconductor production.

* * * * *